United States Patent [19]

Sugiyama et al.

[11] Patent Number: 6,080,600
[45] Date of Patent: Jun. 27, 2000

[54] SEMICONDUCTOR PHOTODIODE AND A METHOD FOR FABRICATING THE SAME

[75] Inventors: Mitsuhiro Sugiyama; Tsutomu Tashiro, both of Tokyo, Japan

[73] Assignee: NEC Corporation, Tokyo, Japan

[21] Appl. No.: 09/020,253

[22] Filed: Feb. 6, 1998

Related U.S. Application Data

[62] Division of application No. 08/805,224, Feb. 24, 1997, Pat. No. 5,731,622.

[30] Foreign Application Priority Data

Feb. 28, 1996 [JP] Japan ..................................... 6-041047

[51] Int. Cl.$^7$ ..................................................... H01L 31/18
[52] U.S. Cl. .............................................. 438/57; 438/563
[58] Field of Search .................................. 438/48, 57, 98, 438/91, 92, 542, 545, 549, 554, 558, 561, 702, 429; 257/466

[56] References Cited

U.S. PATENT DOCUMENTS

| | | | |
|---|---|---|---|
| 4,952,990 | 8/1990 | Gruning . | |
| 5,034,342 | 7/1991 | Sidner et al. | 438/429 |
| 5,177,581 | 1/1993 | Kubo et al. | 257/461 |
| 5,236,863 | 8/1993 | Iranmanesh | 438/429 |
| 5,250,461 | 10/1993 | Sparks | 438/428 |
| 5,360,987 | 11/1994 | Shibib | 257/446 |
| 5,747,860 | 5/1998 | Sugiyama et al. | 257/466 |

FOREIGN PATENT DOCUMENTS

| | | |
|---|---|---|
| 2-291180 | 11/1990 | Japan . |
| 5-291605 | 5/1993 | Japan . |

*Primary Examiner*—Savitri Mulpuri
*Attorney, Agent, or Firm*—Foley & Lardner

[57] ABSTRACT

It is the object of the invention to suppress the leakage current of a semiconductor photodiode. A trench, a side wall of which is covered with and insulating layer, is formed on the surface of a semiconductor substrate of the first conductivity type. Then, an epitaxial layer of the second conductivity type is grown in the trench, where a PN-junction is constructed between the bottom surface of the epitaxial layer and the semiconductor substrate. An impurity diffusion layer of the second conductivity type with higher impurity concentration than that of an internal portion of the epitaxial semiconductor layer is formed over the side surface of the epitaxial layer of the second conductivity type. In the aforementioned structure, when a reverse bias voltage is applied to the PN-junction, a depletion layer does not extend to a neighborhood of the insulating layer, and a leakage current, which flows via surface states near the insulating layer.

3 Claims, 5 Drawing Sheets

SEMICONDUCTOR PHOTODIODE AND A METHOD FOR FABRICATING THE SAME

RELATED APPLICATIONS

This application is a divisional of application Ser. No. 08/805,224, filed Feb. 24, 1997, now U.S. Pat. No. 5,731,622.

FIELD OF THE INVENTION

The invention relates to a semiconductor photodiode used in an optical receiver in a lightwave communication system and a method for fabricating the same, and especially relates to a semiconductor photodiode comprising semiconductor layers produced by means of epitaxial growth, and a method for fabricating the same.

BACKGROUND OF THE INVENTION

FIG. 1 shows a cross-sectional view of a conventional planer-type photodiode comprising semiconductor layers produced by means of selective epitaxial growth, being disclosed in Japanese Patent Application No. 7-52700. After forming a trench on a N—Si substrate 1, a $SiO_2$ layer 2 is grown on the side wall of the trench and a $P^-$—Si epitaxial layer 6 (a light-absorbing layer) and a $P^+$—Si epitaxial layer 5 are grown selectively and continuously.

The impurity concentration of the light-absorbing layer 6 is selected to be less than $1E15$ $cm^{-3}$ in order to make the depletion layer extend to the light-absorbing layer 6, when a reverse bias voltage is applied to a PN-junction. If electric charges are generated in the depleted light-absorbing layer 6 by external optical energy, a photo-electric current arises. On a boundary surface between the light-absorbing layer 6 and the $SiO_2$ layer 2, both shown in FIG. 1, state of crystallizations is disordered, and considerable numbers of surface states are produced thereon. If the reverse bias voltage is applied to the PN-junction and the depletion layer is extended around the aforementioned boundary surface, leakage currents flow via the surface states, and thereby characteristic of the photodiode is deteriorated.

The second example of the conventional photodiode shown in FIG. 2, which brings the aforementioned disadvantages to a settlement, is disclosed in Japanese Patent Kokai No. 5-291605, and has a mesa-shaped cross-section, which has been frequently used in a photodiode comprising compound-type semiconductor layers. In this example, a light-absorbing layer, in which a depletion layer is extended, is a $N^-$-InGaAs layer 24. Since there are many surface states on the mesa-shaped and etched surfaces of the light-absorbing layer 24, P-InP layers 22 are formed on the both side surfaces of the mesa in order to suppress extension of the depletion layers thereto. Then, P-impurity diffusion layers 25 are formed by impurity diffusion in thermal treatment. In this structure, even when a reverse bias voltage is applied to the PN-junction, the depletion layer is hardly extended into the P-impurity diffusion layers 25, the number of the surface states is decreased therein, and the leakage current can be reduced, if the impurity concentration of the P-regions 22 is higher than that of the $N^-$-InGaAs light-absorbing layer 24 by a factor of several hundreds.

FIG. 3 is a cross-sectional view of the third example of a conventional photodiode of diffusion type, which is often used in Si photodiodes, being disclosed in Japanese Patent Kokai No. 2-291180. In this example, the light-absorbing layer, in which the depletion layer extends, is formed in a $N^-$—Si substrate 31. If the depletion layer extends as shown in FIG. 3, the depletion layer extends along the surface of the substrate, which comprises comparatively large numbers of surface states, and a leakage current increases. From a view point of the aforementioned situation, $N^+$-diffusion layers 33 are formed on the surface of the $N^-$-substrate in order to suppress extension of the depletion layer near the surface of the substrate, and thereby increase of the leakage current can be prevented.

In the first example of the conventional photodiodes shown in FIG. 1, the leakage current is liable to flow via the surface states on the boundary surface between the light-absorbing layer 6 and the $SiO_2$ layer 2. The reason is that the state of crystallization of the boundary surface between the light-absorbing layer 6 and the $SiO_2$ layer 2 is disordered, because the light-absorbing layer 6 is formed by process of selective epitaxial growth.

The second example of the conventional semiconductor photodiodes shown in FIG. 2 can be applied only to the mesa-type photodiode, and cannot be applied to the buried-type photodiode shown in FIG. 1. Moreover, since the capacitance of the PN-junction increases in the structure shown in FIG. 2, it becomes obstruction for achieving a photodiode suited for high bit-rate operation. The reason is that the epitaxial growth of the semiconductor layers with an opposite conductivity type to that of the light-absorbing layer is necessary on the both sides of the mesa, after the light-absorbing layer is grown.

The method for decreasing the leakage current shown in FIG. 3 used in the third conventional photodiode is applicable only to the photodiode of diffusion type, in which the light-absorbing layer is formed in the semiconductor substrate, but is not applicable to the photodiode of buried type shown in FIG. 1. The reason is that the $N^+$-impurity diffusion layer is formed on the surface of the substrate near the PN-junction.

SUMMARY OF THE INVENTION

Accordingly, it is an object of the invention to provide a semiconductor photodiode, which has a light-absorbing layer selectively buried in a semiconductor substrate, in which the characteristics of a small leakage current and excellent S/N ratio are obtained without increasing a capacitance of a PN-junction.

It is the further object of the invention to provide a semiconductor photodiode, which has an island-like light-absorbing layer formed on a semiconductor substrate, in which the characteristics of a small leakage current and excellent S/N ratio are obtained without increasing a capacitance of a PN-junction.

It is a still further object of the invention to provide a method for fabricating a semiconductor photodiode, which has a light-absorbing layer buried in a semiconductor substrate, in which the characteristics of a small leakage current and excellent S/N ratio are obtained without increasing a capacitance of a PN-junction.

It is a yet further of the invention to provide a method for fabricating a semiconductor photodiode, which has a island-like light-absorbing layer formed on a semiconductor substrate, in which the characteristics of a small leakage current and excellent S/N ratio are obtained without increasing a capacitance of a PN-junction.

According to the first feature of the invention, a semiconductor photodiode, comprises:

a trench formed on a semiconductor substrate of a first conductivity type;

an insulating layer covering a whole surface of a side wall of the trench;

an epitaxial layer of a second conductivity type grown on a bottom surface of the trench;

an impurity diffusion layer of a second conductivity type having higher impurity concentration than that of an internal portion of the epitaxial layer, and covering a part of a side surface of the epitaxial layer at least;

wherein the semiconductor substrate and the epitaxial layer form a PN-junction.

According to the second feature of the invention, a semiconductor photodiode, comprises:

an island-like epitaxial layer with a second conductivity type formed on a semiconductor substrate of a first conductivity type;

wherein a whole side surface of the island-like epitaxial layer is covered with an insulating layer, and the island-like epitaxial layer and the semiconductor substrate form a PN-junction; and an impurity diffusion layer of a second conductivity type having higher impurity concentration than that of an internal portion of the island-like epitaxial layer and covering a part of a side surface of the island-like epitaxial layer at least.

According to the third feature of the invention, a method for fabricating a semiconductor photodiode, comprises the steps of:

forming a trench on a semiconductor substrate of a first conductivity type;

growing an insulating layer doped with impurity of high concentration, suited for producing a semiconductor of a second conductivity type, on a surface of the semiconductor substrate and an inner surface of the trench;

eliminating the insulating layer except that on a side wall of the trench by means of anisotropic etching;

selectively growing an epitaxial layer of a second conductivity type in the trench;

forming an impurity diffusion layer of a second conductivity type on a part of a side surface of the epitaxial layer at least by thermal treatment;

wherein concentration of impurity in the impurity diffusion layer, being thermally diffused from the insulating layer, is higher than that of an internal portion of the epitaxial layer.

According to the fourth feature of the invention, a method for fabricating a semiconductor photodiode, comprises the steps of:

forming an epitaxial layer of a second conductivity type on a semiconductor substrate of a first conductivity type;

etching predetermined parts of the epitaxial layer to produce an island-like epitaxial layer;

growing an insulating layer doped with impurity of high concentration, suited for producing a semiconductor of a second conductivity type, on surfaces of the semiconductor substrate and the island-like epitaxial semiconductor layer;

eliminating the insulating layer except a side surface of the island-like epitaxial layer by means of anisotropic etching;

forming an impurity diffusion layer of a second conductivity type on a part of a side surface of the island-like epitaxial layer at least by thermal treatment;

wherein concentration of impurity in the impurity diffusion layer, being thermally diffused from the insulating layer, is higher than that of an internal portion of the epitaxial layer.

The principle of the invention can be summarized as follows. In this invention, the impurity diffusion layer with high impurity concentration is formed on a part of a side surface of the light-absorbing layer (the epitaxial layer of the second conductivity type) at least, and the depletion layer, which starts from the PN-junction and extends toward the light-absorbing layer, can hardly pass through the impurity diffusion layer. Then, the depletion layer cannot extend along the boundary surface between the light-absorbing layer and the insulating layer, and there are few surface states in the depletion layer. Subsequently, the leakage current is decreased, when the reverse bias voltage is applied to the PN-junction.

BRIEF DESCRIPTION OF THE DRAWINGS

The invention will be explained in more detail in conjunction with the appended drawings, wherein.

DESCRIPTION OF THE PREFERRED EMBODIMENTS

Figure 1:
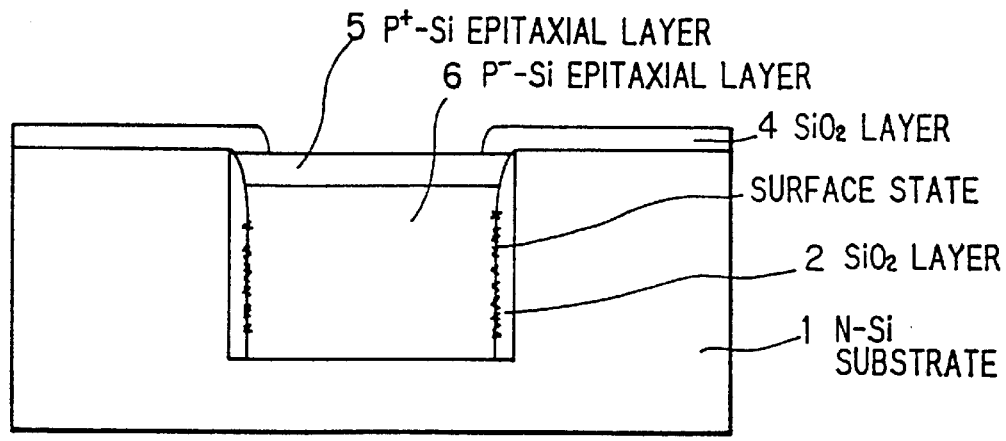
FIG. 1 is a cross-sectional view of the first conventional photodiode.
Figure 2:
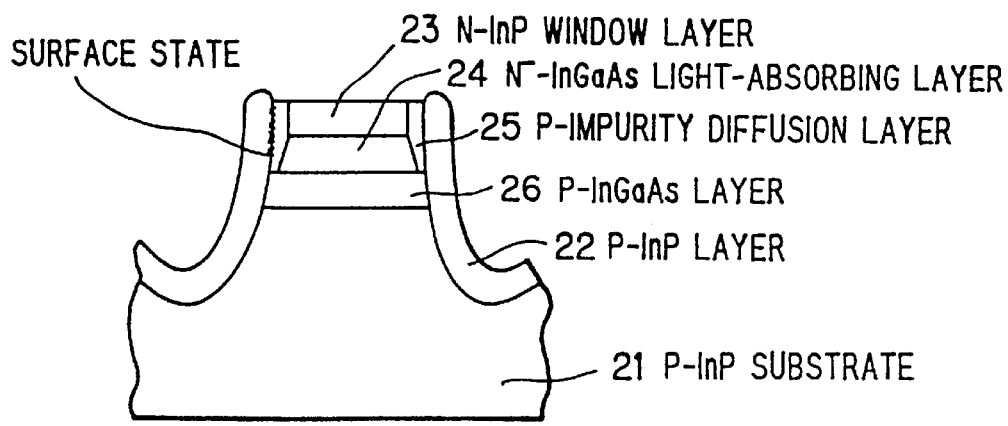
FIG. 2 is a cross-sectional view of the second conventional photodiode.
Figure 3:
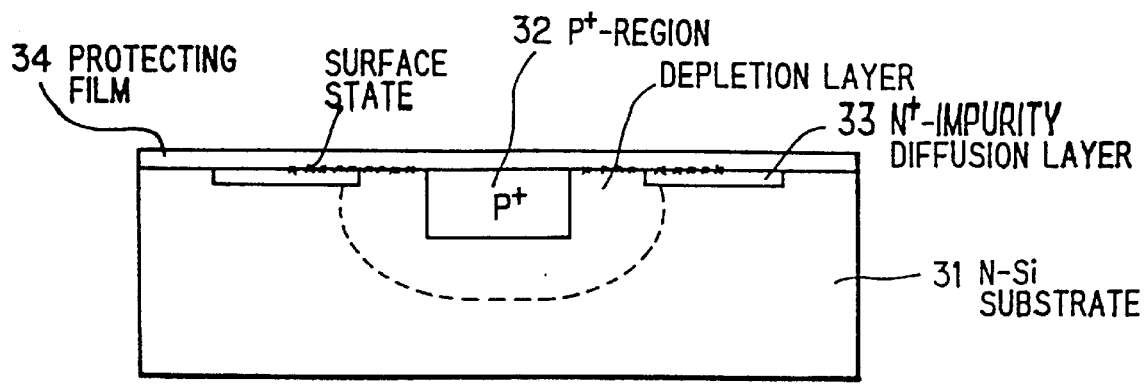
FIG. 3 is a cross-sectional view of the third conventional photodiode.
Figure 4:
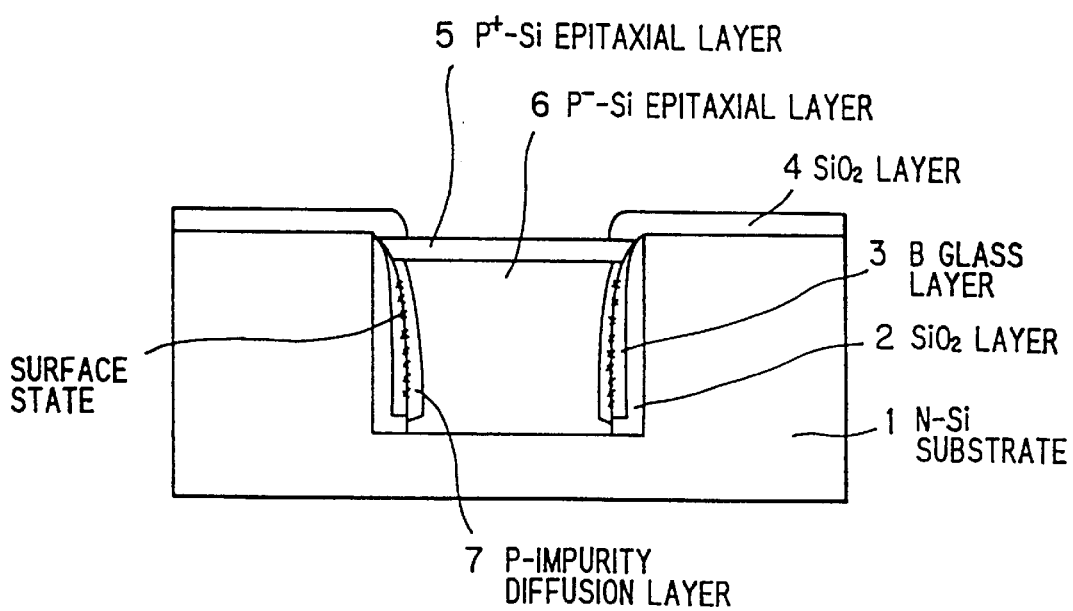
FIG. 4 is a cross-sectional view showing a semiconductor photodiode of the first preferred embodiment of the invention.

Next, the invention will be explained referring to the appended drawings. FIG. 4 is a cross-sectional view showing a semiconductor photodiode of the first preferred embodiment of the invention. In this embodiment, a trench is formed on the N—Si substrate 1, and on the side wall of the trench, a $SiO_2$ layer 2 and a B (boron) glass layer 3, containing B of high concentration, are successively grown. In an inner space of these layers, a P—Si epitaxial layer 6 and a P$^+$—Si epitaxial layer 5 are successively grown. Moreover, a P-diffusion layer 7 is formed by impurity diffusion from the B glass layer 3.

Figure 5A:
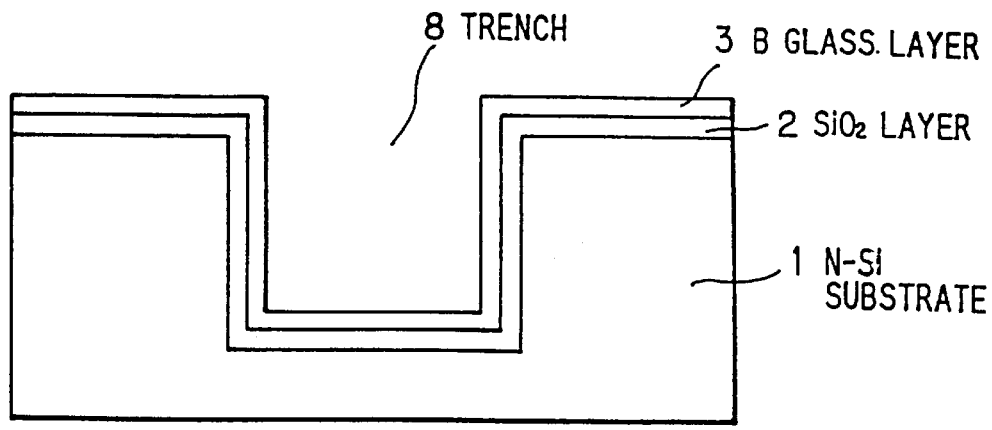
FIGS. 5A to 5C are cross-sectional views showing a method of fabricating the semiconductor photodiode of the first preferred embodiment of the invention.
Figure 5B:
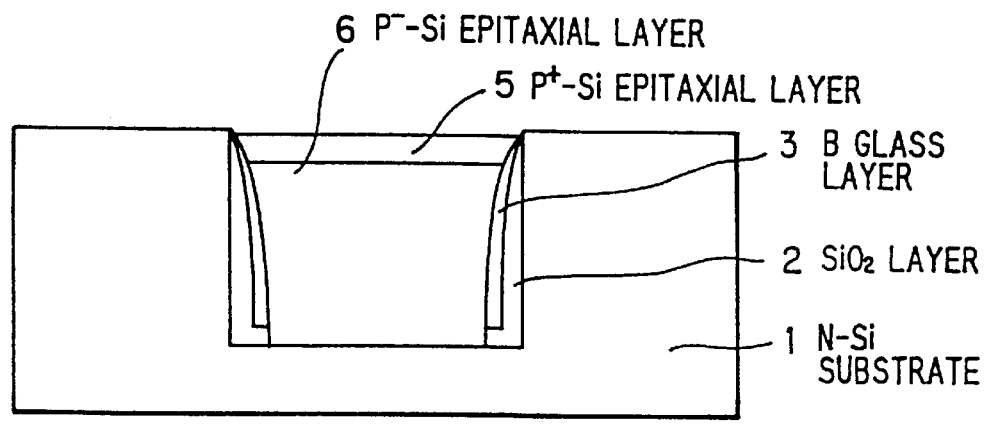
Figure 5C:
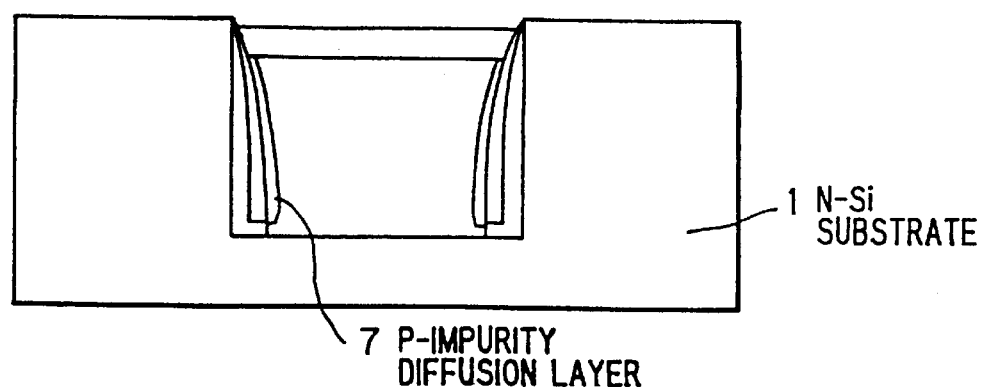

FIGS. 5A to 5C are cross-sectional views sequentially showing the method for fabricating the semiconductor photodiode of the first preferred embodiment of the invention. First, as shown in FIG. 5A, a 0.1 μm deep trench 8 is selectively formed by dry-etching a N—Si substrate 1 with impurity concentration of about 5E16 cm$^{-3}$. Next, a 1000Å thick $SiO_2$ layer 2 is grown thereon, and subsequently a 1000Å thick B glass layer 3 with high B concentration is grown. Then, after the B glass layer 3 and the $SiO_2$ layer 2 are etched-back by anisotropic dry-etching, a P$^-$—Si epitaxial layer (a light-absorbing layer) 6 with impurity concentration of 1E 15 cm$^{-3}$ and a P$^+$—Si epitaxial layer 5 with an impurity concentration 1E20 cm$^{-3}$ are continuously grown, and a structure shown in FIG. 5B can be obtained.

Next, by applying thermal-treatment of 800° C., a 500Å wide P-diffusion layer 7 with an impurity concentration 1E18 $cm^{-3}$ is obtained. A semiconductor photodiode according to the invention is achieved by the aforementioned process.

Next, the operation of the semiconductor photodiode according to the invention will be explained referring to FIG. 4. When a reverse bias voltage is applied to the PN-junction in FIG. 4, a depletion layer extends in the $P^-$—Si epitaxial layer 6 with low impurity concentration. On the other hand, the depletion layer can hardly extend into the P-impurity diffusion layer 7, because the impurity concentration thereof is higher than that of the $P^-$-epitaxial layer 6 by a factor of several hundreds. Especially, the feature of the photodiode with the about 1.0 μm deep light-absorbing layer shown as the embodiment of the invention is that, the photodiode operates at a low impressed voltage, and then, the impressed voltage is about 5 V at most. When the voltage of about the aforementioned value is applied to the photodiode, the light-absorbing layer 6 with low impurity concentration is easily depleted, but the P-impurity diffusion layer 7 is not depleted. Accordingly, the surface. states shown in FIG. 4 do not enter the depletion layer, and the leakage current flowing via the surface states can be decreased.

In the embodiment shown in FIG. 4, the reason why the $SiO_2$ layer 2 with no impurity is used at portion of the side wall of the trench is that the P-impurity diffusion layer 7 can avoid directly contacting with the N—Si substrate 1, because of the presence of the $SiO_2$ layer 2. If the P-impurity diffusion layer 7 directly contacts with the Si substrate 1, increases of capacitance and decrease of a withstand voltage of the PN-junction are inevitable, and high bit-rate performance and reliability of the photodiode will be deteriorated to some extent.

Figure 6:
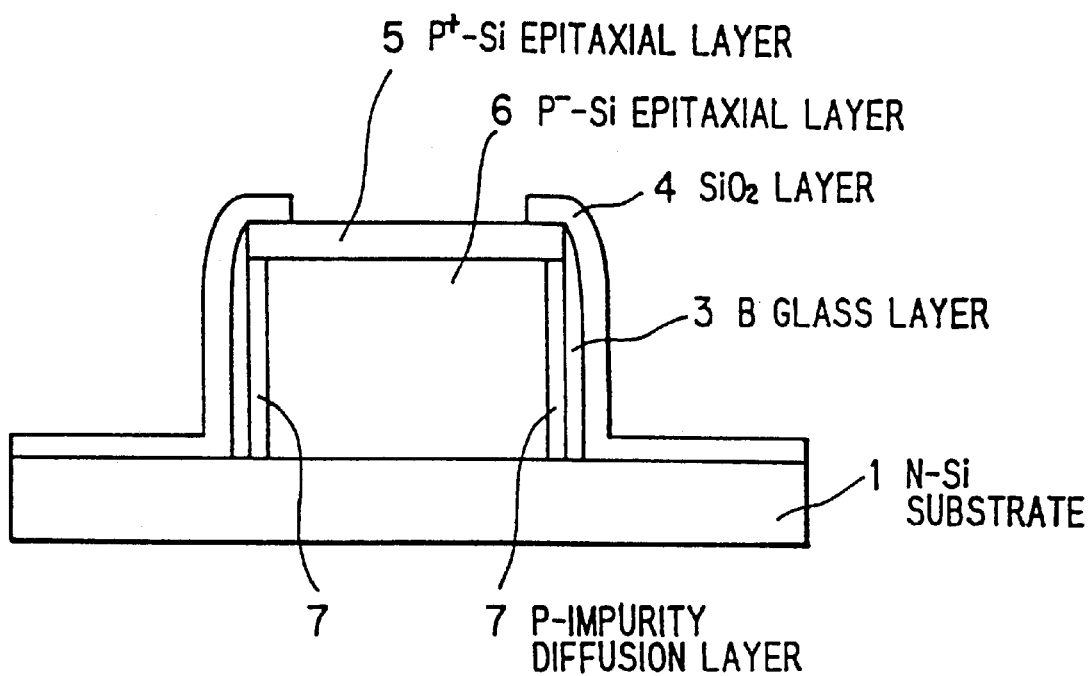
FIG. 6 is a cross-sectional view showing a semiconductor photodiode of the second preferred embodiment of the invention.

FIG. 6 is a cross sectional view showing a semiconductor photodiode of the second preferred embodiment of the invention. In this embodiment, an island-like $P^-$—Si epitaxial layer 6 and a $P^+$—Si epitaxial layer 5 are grown on a N—Si substrate 1, and a B glass layer 3 is formed on side surfaces of the aforementioned epitaxial layers. A P-impurity diffusion layer 7 is obtained by impurity diffusion from the B glass layer 3.

Figure 7A:
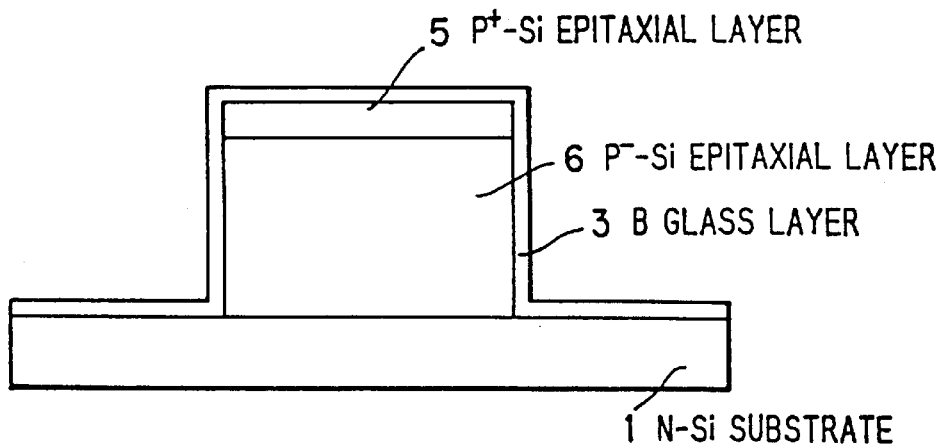
FIGS. 7A to 7C are cross-sectional views showing a method of fabricating the semiconductor photodiode the second preferred embodiment of the invention.
Figure 7B:
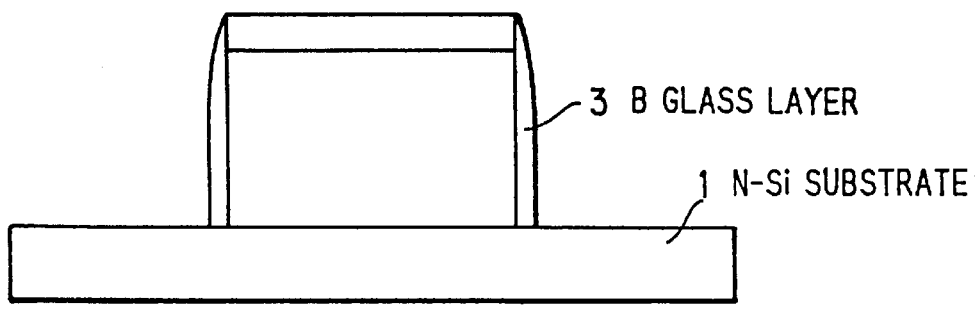
Figure 7C:
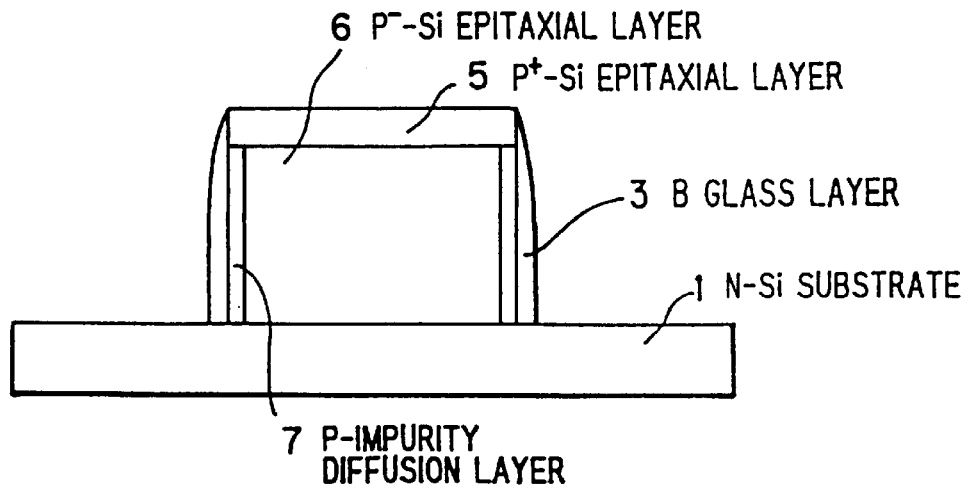

FIGS. 7A to 7C are cross-sectional views showing the method of fabricating the semiconducor photodiode of the second referred embodiment. The impurity concentration of each of the layers is the same as that of the first preferred embodiment. First, after the $P^-$—Si epitaxial layer 6 and the $P^+$—Si epitaxial layer 5 are successively grown on the N—Si substrate, the island-like epitaxial layer is obtained as shown in FIG. 7A by dry-etching predetermined parts. Next, a B glass layer 3 with a thickness of 1000Å is grown over the whole surfaces of the island-like epitaxial layer and the N—Si substrate as shown in FIG. 7A. Then, the B glass layer 3 is etched back by anisotropic dry etching, and the B glass on the side surfaces of the island-like epitaxial layers is remained as shown in FIG. 7B. Subsequently, a P-impurity diffusion layer 7 is obtained by thermal treatment of about 800° C. similarly to the case of the first preferred embodiment of the invention.

The operation of the second preferred embodiment is entirely the same as that of the first preferred embodiment, and the present invention is applicable to photodiodes of both the buried and mesa types. Moreover, it is evident that the light-absorbing layer used in the embodiment of the invention is never restricted to the P—Si epitaxial layer, and the invention is applicable to photodiodes of other conductivity type and those made of other materials.

As mentioned in the above, the effect of the invention is that the leakage current is suppressed by changing the region, where surface states exist, into that with high impurity concentration. Consequently, the depletion layer does not extend into the region where surface states exist.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A method for fabricating a semiconductor photodiode, comprising the steps of:

forming an epitaxial layer of a second conductivity type on a semiconductor substrate of a first conductivity type;

etching predetermined parts of said epitaxial layer to produce an island-like epitaxial layer;

growing an insulating layer doped with impurity of high concentration, suited for producing a semiconductor of a second conductivity type, on surfaces of said semiconductor substrate and said island-like epitaxial semiconductor layer;

eliminating said insulating layer except a side surface of said island-like epitaxial layer by means of anisotropic etching; and forming an impurity diffusion layer of a second conductivity type on a part of a side surface of said island-like epitaxial layer at least by thermal treatment;

wherein said island-like epitaxial layer and said semiconductor substrate form a PN-junction for said semiconductor photodiode, and wherein concentration of impurity in said impurity diffusion layer, being thermally diffused from said insulating layer, is higher than that of an internal portion of said island-like epitaxial layer.

2. A method for fabricating a semiconductor photodiode, according to claim 1, wherein:

said epitaxial semiconductor layer serves as a light-absorbing layer.

3. A method for fabricating a semiconductor photodiode, according to claim 1, wherein:

a part of said insulating layer comprises no impurity.

* * * * *

UNITED STATES PATENT AND TRADEMARK OFFICE
CERTIFICATE OF CORRECTION

PATENT NO. : 6,080,600
DATED : June 27, 2000
INVENTOR(S) : Mitsuhiro SUGIYAMA, et al..

It is certified that error appears in the above-identified patent and that said Letters Patent is hereby corrected as shown below:

Title page,

Item [30] Foreign Application Priority Data delete "6-041047" and replace with --8-041047--.

Signed and Sealed this

Tenth Day of April, 2001

Attest:

NICHOLAS P. GODICI

Attesting Officer     Acting Director of the United States Patent and Trademark Office